United States Patent
Deshpande et al.

(10) Patent No.: US 9,941,246 B2
(45) Date of Patent: Apr. 10, 2018

(54) ELECTRONIC ASSEMBLY THAT INCLUDES STACKED ELECTRONIC DEVICES

(71) Applicant: Intel Corporation, Santa Clara, CA (US)

(72) Inventors: Nitin Deshpande, Chandler, AZ (US); Ravi V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/648,998

(22) PCT Filed: Jul. 2, 2014

(86) PCT No.: PCT/US2014/045217
§ 371 (c)(1),
(2) Date: Jun. 2, 2015

(87) PCT Pub. No.: WO2016/003456
PCT Pub. Date: Jan. 7, 2016

(65) Prior Publication Data
US 2016/0260688 A1 Sep. 8, 2016

(51) Int. Cl.
*H01L 25/00* (2006.01)
*H01L 25/065* (2006.01)
(Continued)

(52) U.S. Cl.
CPC .......... *H01L 25/0657* (2013.01); *H01L 21/52* (2013.01); *H01L 21/76898* (2013.01);
(Continued)

(58) Field of Classification Search
CPC ..... H01L 25/0657; H01L 23/04; H01L 25/50; H01L 21/76898; H01L 21/52;
(Continued)

(56) References Cited

U.S. PATENT DOCUMENTS 6,031,284 A * 2/2000 Song .............. H01L 23/13
257/686
2008/0128882 A1* 6/2008 Baek .............. H01L 21/568
257/686
(Continued)

FOREIGN PATENT DOCUMENTS

CN 102106194 A 6/2011
CN 103855129 A 6/2014
(Continued)

OTHER PUBLICATIONS

"Taiwanese Application Serial No. 104117626, Office Action dated Mar. 21, 2016", w/ English Claims, 12 pgs.
(Continued)

*Primary Examiner* — Cuong B Nguyen
(74) *Attorney, Agent, or Firm* — Schwegman Lundberg & Woessner, P.A.

(57) ABSTRACT

An electronic assembly that includes a first electronic device. The first electronic device includes a cavity that extends into a back side of the first electronic device. The electronic assembly further includes a second electronic device. The second electronic device is mounted to the first electronic device within the cavity in the first electronic device. In some example forms of the electronic assembly, the first electronic device and the second electronic device are each a die. It should be noted that other forms of the electronic assembly are contemplated where only one of the first electronic device and the second electronic device is a die. In some forms of the electronic assembly, the second electronic device is soldered to the first electronic device.

7 Claims, 9 Drawing Sheets

(51) Int. Cl.
  *H01L 21/52* (2006.01)
  *H01L 21/768* (2006.01)
  *H01L 23/04* (2006.01)
  *H01L 49/02* (2006.01)

(52) U.S. Cl.
  CPC .............. *H01L 23/04* (2013.01); *H01L 25/50* (2013.01); *H01L 28/00* (2013.01); *H01L 2225/06544* (2013.01); *H01L 2225/06555* (2013.01); *H01L 2225/06568* (2013.01); *H01L 2225/06589* (2013.01); *H01L 2924/0002* (2013.01)

(58) Field of Classification Search
  CPC ........... H01L 2225/06555; H01L 28/00; H01L 2225/06568; H01L 2225/06589; H01L 2225/06544; H01L 2924/0002
  See application file for complete search history.

(56) References Cited

U.S. PATENT DOCUMENTS

| | | | |
|---|---|---|---|
| 2008/0142961 A1* | 6/2008 | Jones | H01L 25/165 257/724 |
| 2010/0102428 A1* | 4/2010 | Lee | H01L 25/0657 257/686 |
| 2011/0068459 A1 | 3/2011 | Pagaila et al. | |
| 2013/0181354 A1 | 7/2013 | Khan et al. | |
| 2013/0252378 A1 | 9/2013 | Jeng et al. | |
| 2014/0159247 A1 | 6/2014 | Lyne et al. | |
| 2014/0353838 A1* | 12/2014 | Lin | H01L 24/97 257/773 |

FOREIGN PATENT DOCUMENTS

| | | |
|---|---|---|
| CN | 105377390 A | 3/2016 |
| KR | 20120000770 A | 1/2012 |
| KR | 102012013587 A | 12/2012 |
| TW | 200913214 A | 3/2009 |
| TW | 201613038 A | 4/2016 |
| WO | WO-2016003456 A1 | 1/2016 |

OTHER PUBLICATIONS

"International Application Serial No. PCT/US2014/045217, International Search Report dated Mar. 30, 2015", 3 pgs.
"International Application Serial No. PCT/US2014/045217, Written Opinion dated Mar. 30, 2015", 7 pgs.
"Korean Application Serial No. 10-2015-7017098, Office Action dated Aug. 22, 2016", W/ English Translation, 8 pgs.
"Korean Application Serial No.10-2015-7017098, Response filed Nov. 22, 2016 to Office Action dated Aug. 22, 2016", W/ English Translation of Claims, 16 pgs.
"Taiwanese Application Serial No. 104117626, Response filed Sep. 21, 2016 to Office Action dated Mar. 21, 2016", W/ English Translation of Claims, 41 pgs.
"International Application Serial No. PCT/US2014/045217, International Preliminary Report on Patentability dated Jan. 12, 2017", 9 pgs.
"Taiwanese Application Serial No. 104117626, Office Action dated Dec. 9, 2016", w/ English Claims, 16 pgs.
"Chinese Application Serial No. 201480003722.0, Office Action dated May 31, 2017", w/English Traslation, 15 pgs.

* cited by examiner

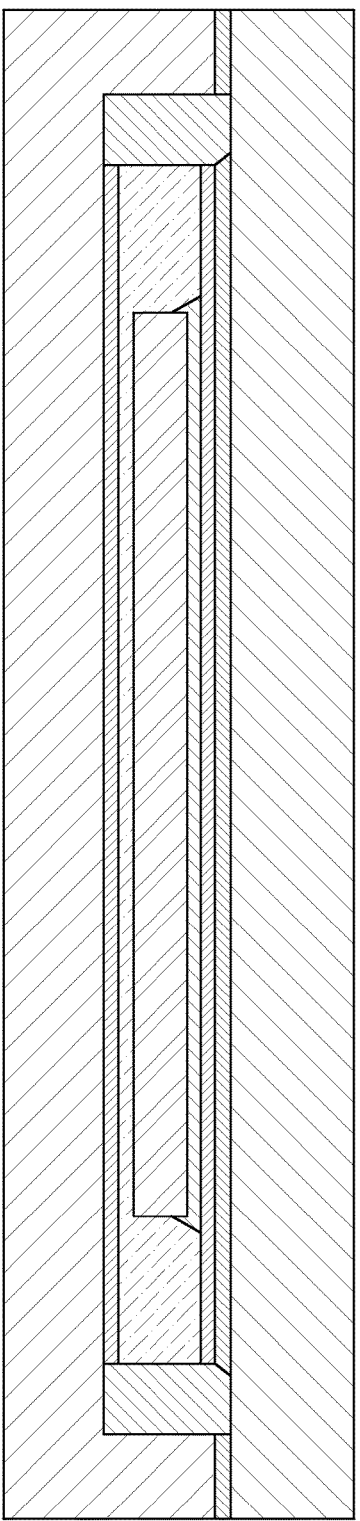
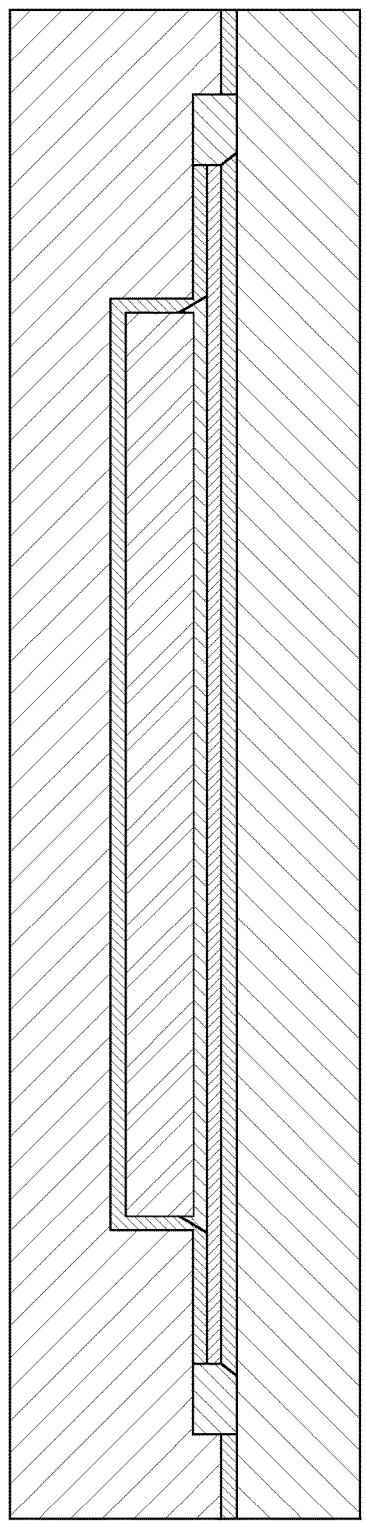
FIG. 1
(PRIOR ART)
FIG. 2
(PRIOR ART)

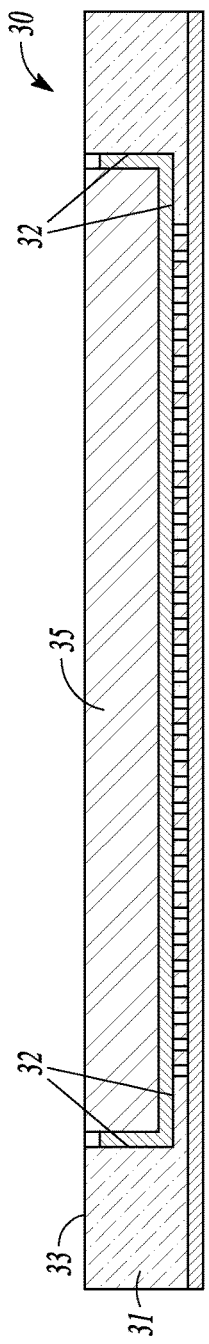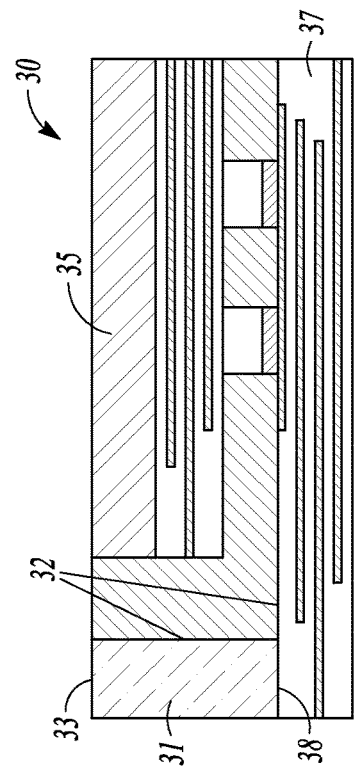
FIG. 3
FIG. 4
FIG. 5

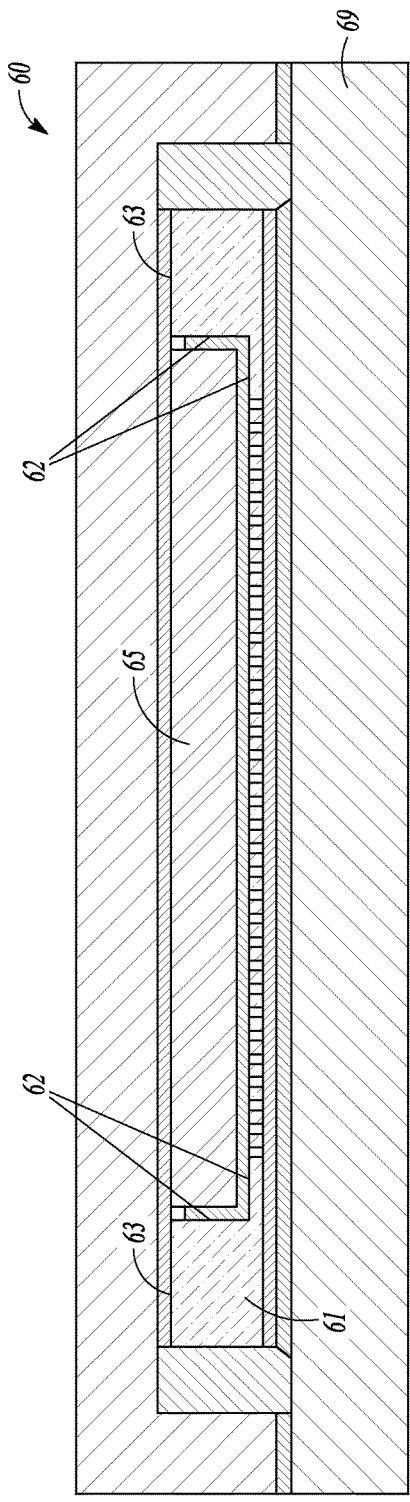
FIG. 6
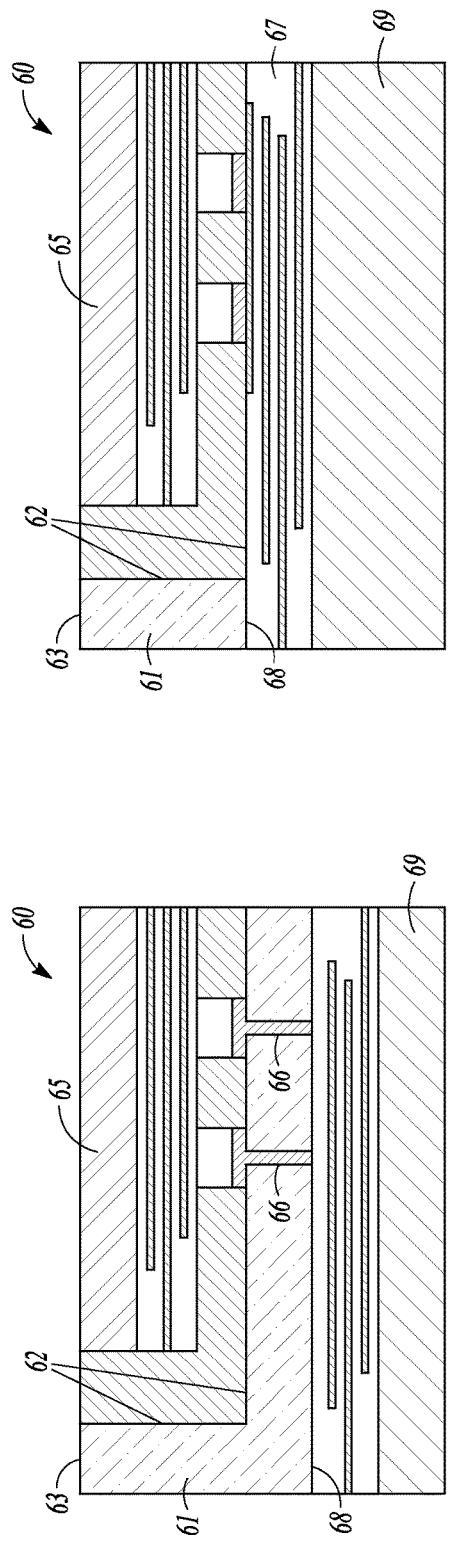
FIG. 7
FIG. 8

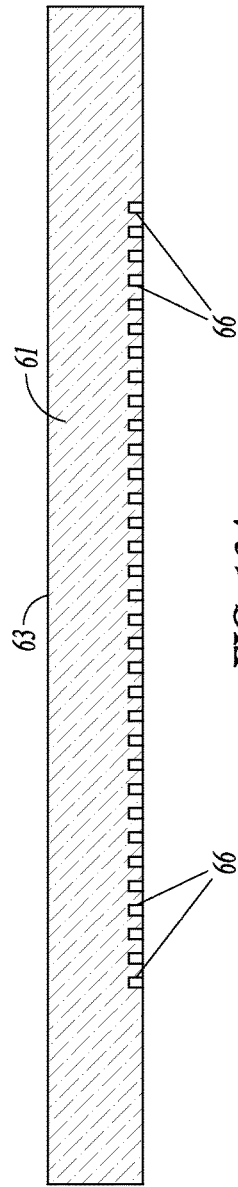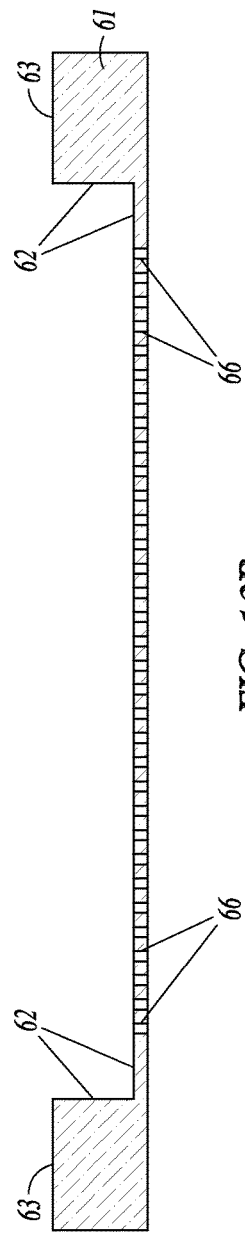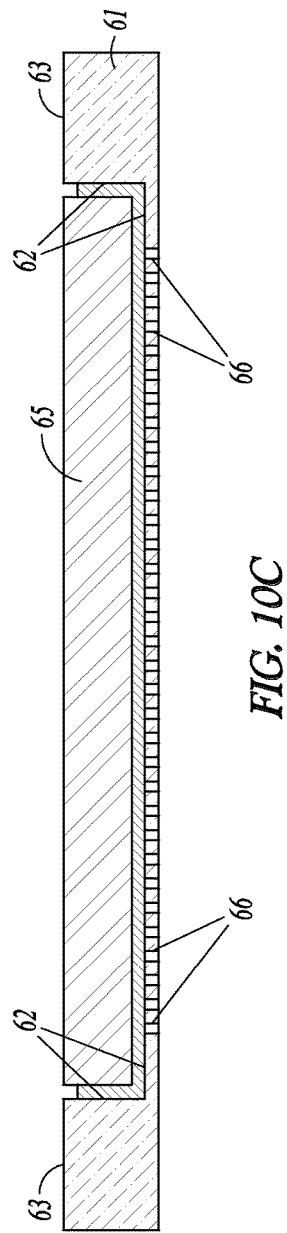

ELECTRONIC ASSEMBLY THAT INCLUDES STACKED ELECTRONIC DEVICES

This application is a U.S. National Stage Filing under 35 U.S.C. 371 from International Application No. PCT/US2014/045217, filed Jul. 2, 2014, which is incorporated herein by reference in its entirety.

TECHNICAL FIELD

Embodiments described herein generally relate to electronic assemblies, and more particularly to electronic assemblies that include stacked electronic devices.

BACKGROUND

One important consideration that is associated with producing electronic assemblies that include stacked electronic devices (e.g., dies or chips) relates to effectively dissipating heat from the bottom electronic device in a stack of electronic devices. Another important consideration relates to the ability to handle thin wafers or dice that include through silicon vias (TSVs) for subsequent stacking of one or more additional electronic devices onto the thin wafers or dice.

FIG. 1 shows a prior art electronic package 10 that uses a high thermal conductivity mold material to dissipate heat from the bottom electronic device in a stack of electronic devices. The high thermal conductivity mold material is positioned between a top most electronic device in the stack of electronic devices and a heat spreader.

FIG. 2 shows another prior art electronic package 20 that uses a stepped integrated heat spreader (IHS) to dissipate heat from the bottom electronic device in a stack of electronic devices. Using a stepped IHS often offers limited control of the thickness of the thermal interface material (TIM) bonding layer that is between a top most electronic device in the stack of electronic devices and the IHS. The thickness of the TIM bonding layer is difficult to control due to tolerance issues that are typically associated with stacking electronic devices.

One of the ways that thermal management issues are addressed in the prior art electronic assemblies illustrated in FIGS. 1 and 2 is to increase the thermal conductivity of the TIM bonding layer. However, increasing the thermal conductivity of the TIM bonding layer is usually not adequate alone.

The thickness of the bottom electronic device in the stack of electronic devices that are included in the prior art electronic assemblies illustrated in FIGS. 1 and 2 is typically about 100 um. This minimal thickness of the bottom electronic device often makes it problematic to safely and efficiently handle the bottom electronic device during production of the electronic assemblies that include stacked electronic devices.

BRIEF DESCRIPTION OF THE DRAWINGS

FIG. 1 shows a prior art electronic assembly that uses a high thermal conductivity mold material to dissipate heat from the bottom electronic device in a stack of electronic devices.

FIG. 2 shows another prior art electronic assembly that uses a stepped integrated heat spreader (IHS) to dissipate heat from the bottom electronic device in a stack of electronic devices.

FIG. 3 illustrates an example electronic assembly.

FIG. 4 shows an enlarged view of a portion of the electronic assembly shown in FIG. 3.

FIG. 5 shows an enlarged view illustrating a portion of another form of the electronic assembly shown in FIG. 3.

FIG. 6 illustrates an example electronic package.

FIG. 7 shows an enlarged view of a portion of the electronic package shown in FIG. 6.

FIG. 8 shows an enlarged view illustrating a portion of another form of the electronic package shown in FIG. 6.

FIGS. 10A-10D show an example packaging process (i.e., assembly flow) for the electronic packages illustrated in FIGS. 6 and 7.

DESCRIPTION OF EMBODIMENTS

Figure 9:
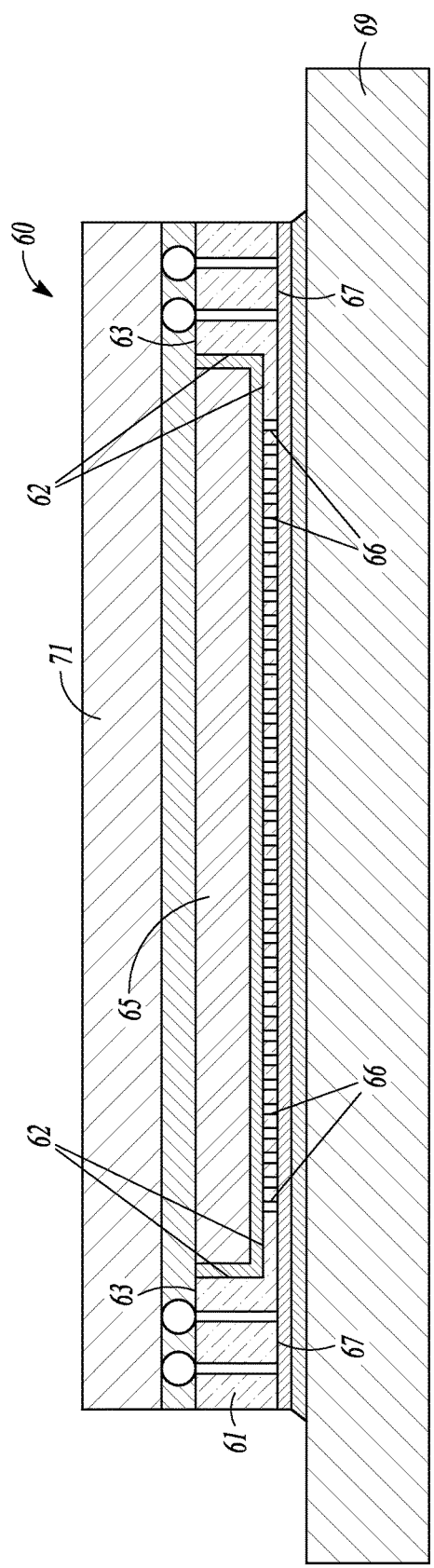
FIG. 9 shows the electronic package of FIG. 6 where the electronic package includes a third electronic component.
Figure 10D:
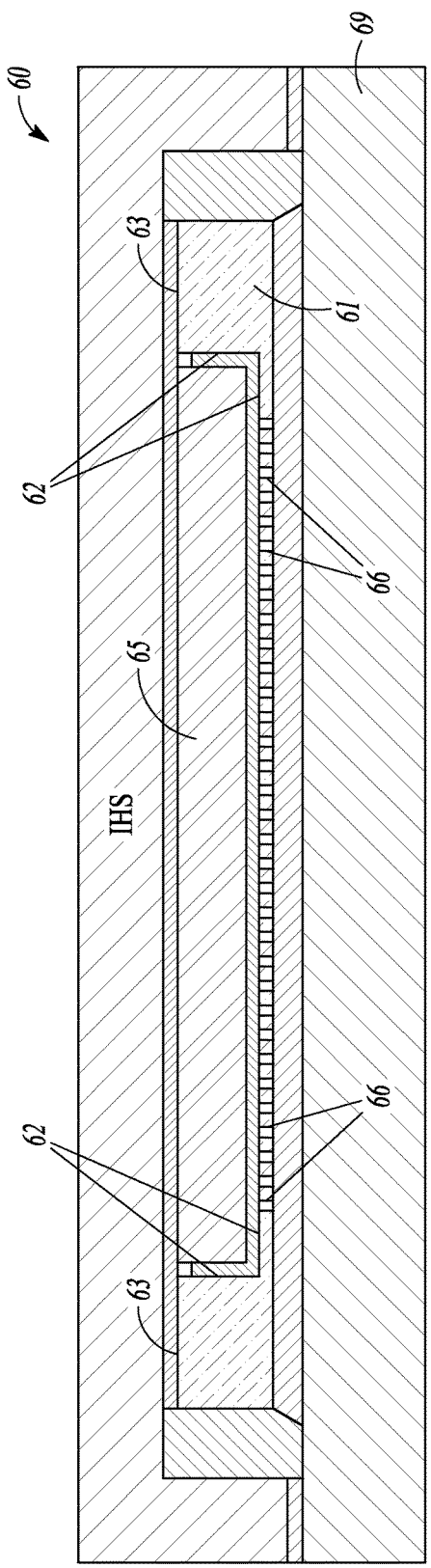
Figure 11A:
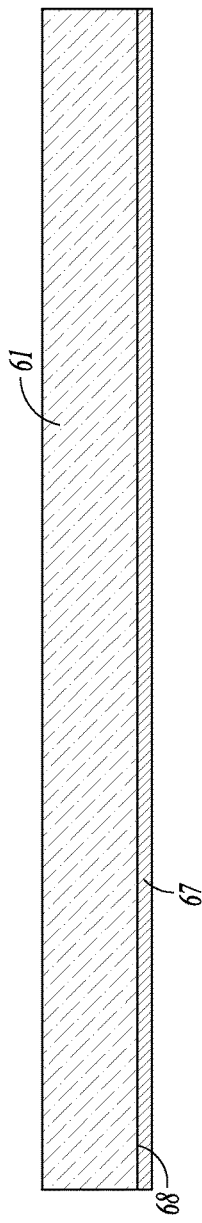
FIGS. 11A-11D show an example packaging process (i.e., assembly flow) for the electronic packages illustrated in FIG. 8.
Figure 11B:
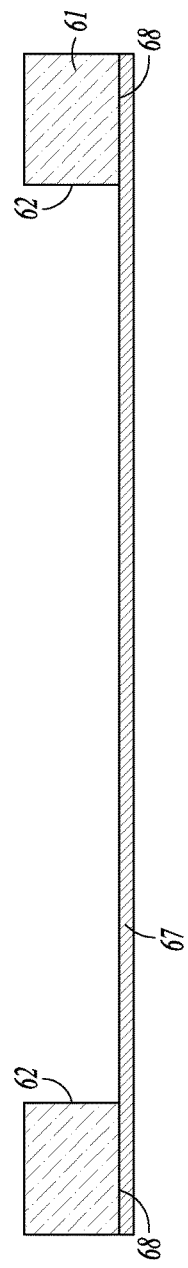
Figure 11C:
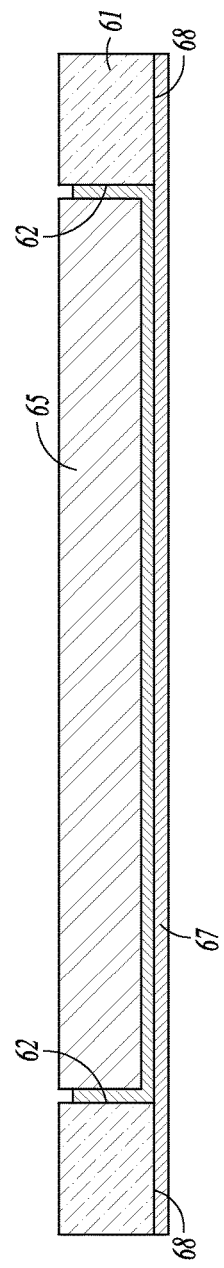
Figure 11D:
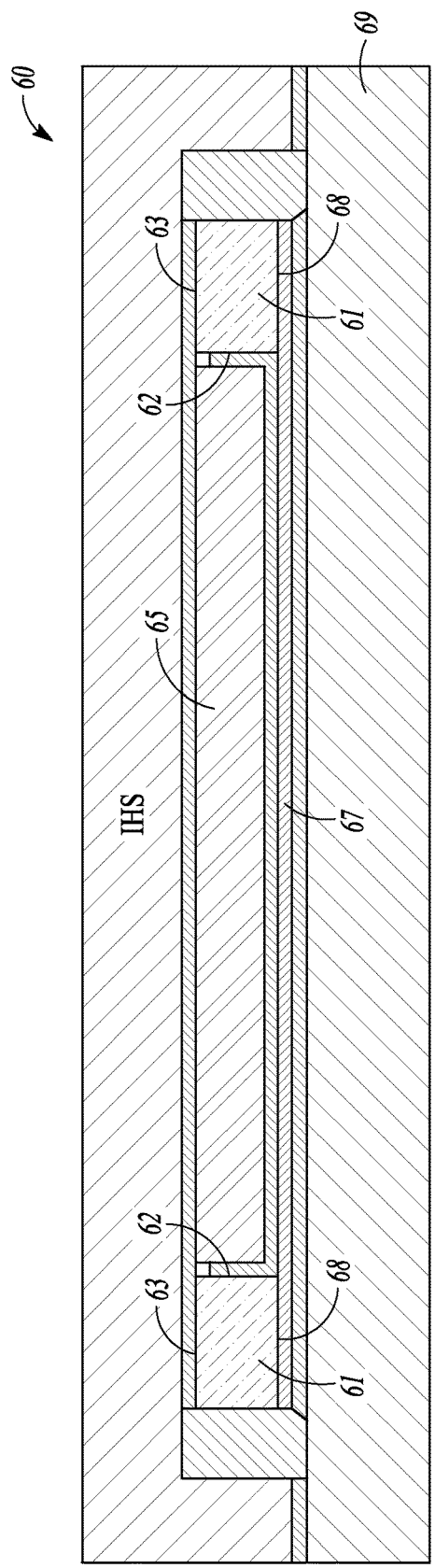

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

FIG. 3 shows an example electronic assembly 30. The electronic assembly 30 includes a first electronic device 31. The first electronic device 31 includes a cavity 32 that extends into a back side 33 of the first electronic device 31.

The electronic assembly 30 further includes a second electronic device 35. The second electronic device 35 is mounted to the first electronic device 31 within the cavity 32 in the first electronic device 31.

In the examples shown herein, the first electronic device 31 and the second electronic device 35 are each a die. It should be noted that other forms of the electronic assembly 30 are contemplated where only one of the first electronic device 31 and the second electronic device 35 is a die.

FIG. 3 shows an example electronic assembly 30 where the second electronic device 35 is soldered to the first electronic device 31. It should be noted that the second electronic device 35 may be attached to the first electronic device 31 in other ways. The manner in which the second electronic device 35 is attached to the first electronic device 31 will depend in part on the desired configuration and functionality of the electronic assembly 30.

FIG. 4 shows an enlarged view of a portion of the electronic assembly 30 shown in FIG. 3. In the example electronic assembly 30 shown in FIGS. 3 and 4, the cavity 32 in the first electronic device 31 extends partially through the first electronic device 31. In some forms, the first electronic device 31 includes through silicon vias 36 that are electrically connected to the second electronic device 35.

In some forms of the electronic assembly 30, the cavity 32 is etched into the first electronic device 31 such that the second electronic device 35 fits in this etched cavity 32 and electrically connects the second electronic device 35 to the first electronic device 31 (e.g., through flip-chip interconnects). The non-etched portion of the first electronic device 31 provides a path for thermally dissipating heat from the etched part of the first electronic device 31. In addition, the non-etched portion of the first electronic device 31 provides mechanical rigidity to the electronic assembly 30 during fabrication of the electronic assembly 30.

In some forms of the electronic assembly 30 shown in FIGS. 3 and 4, it may not be necessary to grind the entire bottom surface of a wafer that includes multiple first electronic devices 31 (e.g., dice) before respective second electronic devices are stacked onto the first electronic devices 31. Instead, only the portion of the wafer where top dice need to fit within cavities is etched in the wafer. It should be noted that various designs for TSVs (or non-TSV) based interconnects may be created in the etched cavities in order to attach the second electronic devices 35 onto the wafer. The interconnects and cavities that surround the respective second electronic devices 35 may then be filled with epoxy (or some other appropriate material).

It should be noted that the configuration of the electronic assemblies 30 described herein may not add to the overall height of the electronic assembly 30 since the height of the non-etched portion of the first electronic device 31 is more controllable. In addition, the non-etched portion of the first electronic device 31 is a better conductor of heat and improves heat spreading from the first electronic device 31 as compared to using a stepped IHS or a high conductivity polymer. The non-etched portion of the first electronic device 31 may also provide structural rigidity for first electronic device 31 thereby making handling of the first electronic device 31 much easier during fabrication of electronic assembly 30.

It should be noted that the configuration of the electronic assemblies 30 described herein may allow a top surface of the cavity 32 in the first electronic device 31 to be used as a hard stop for accurate Z positioning of other electronic devices that may be stacked onto the first electronic device 31. In addition, the electronic assemblies may provide a flat surface on top of a stack of electronic devices for subsequent attachment of an IHS. In some forms of the electronic assemblies, the top electronic device in the stack of electronic devices may contain an active die or only integrated passives such as inductors including magnetic core inductors built using silicon or capacitors including MIM (Metal-Insulator-Metal) capacitors to improve power delivery performance.

FIG. 5 shows an enlarged view illustrating a portion of another form of the electronic assembly 30 shown in FIG. 3. In the example electronic assembly 30 shown in FIG. 5, the cavity 32 in the first electronic device 31 extends through a part of the first electronic device 31. The first electronic device 31 may include an interposer 37 on a front side 38 of the first electronic device 31. The first electronic device 31 may be mounted to the interposer 37 and/or the second electronic device 35. In some forms of the interposer 37, the first electronic device 31 is a passive device with front side metal interconnects serving as interposers (i.e., interposer 37 is part of electronic device 31).

It should be noted that the configuration of the electronic assemblies 30 described herein may allow for a 2.5D stacking of chips without having to fabricate TSVs in the first electronic device. In addition, the electronic assemblies may be used for various 3D as well as 2.5D stacking schemes.

FIG. 6 shows an example electronic package 60. The electronic package 60 includes a substrate 69 and a first electronic device 61 that is mounted on the substrate 69. The first electronic device 61 includes a cavity 62 that extends into a back side 63 of the first electronic device 61.

The electronic package 60 further includes a second electronic device 65. The second electronic device 65 is mounted to the first electronic device 61 within the cavity 62 in the first electronic device 61.

FIG. 6 shows an example electronic package where the second electronic device 65 is soldered to the first electronic device 61. It should be noted that the second electronic device 65 may be attached to the first electronic device 61 in other ways. The manner in which the second electronic device 65 is attached to the first electronic device 61 will depend in part on the desired configuration and functionality of the electronic package 60.

FIG. 7 shows an enlarged view of a portion of the electronic package 60 shown in FIG. 6. In the example electronic package 60 shown in FIGS. 6 and 7, the cavity 62 in the first electronic device 61 extends partially through the first electronic device 61. In some forms, the first electronic device 61 includes through silicon vias 66 that are electrically connected to the second electronic device 65 and/or the substrate 69.

FIG. 8 shows an enlarged view illustrating a portion of another form of the electronic package 60 shown in FIG. 6. In the example electronic package 60 shown in FIG. 8, the cavity 62 in the first electronic device 61 extends through a part of the first electronic device 61. The first electronic device 61 may include an interposer 67 on a front side 68 of the first electronic device 61. The first electronic device 61 may be mounted to the interposer 67 and/or the second electronic device 65.

The interposer 67 and the substrate 69 may be formed of silicon. In still other example forms of the electronic package 60, at least one of the interposer 67 and the substrate 69 is glass. Other example materials for the interposer 67 and the substrate 69 include, but are not limited to, silicon, glass, silicon on isolator, silicon carbide (SiC), gallium arsenide, organic substrates and laminates, etc. It should be noted that the interposer 67 and the substrate 69 may be the same material or different materials. It should be noted that any technique that is known now, or discovered in the future, may be used to attach the interposer 67 to the substrate 69 and form electrical connections between the interposer 67 and the substrate 69.

FIG. 9 shows the electronic package 60 of FIG. 6 where the electronic package 60 includes a third electronic device 71. In the examples shown herein, the first, second and third electronic devices 61, 65, 71 are each a die. It should be noted that other forms of the electronic package 60 are contemplated where only one or two of the first, second and third electronic devices 61, 65, 71 is a die.

The third electronic device 71 may be mounted to the first electronic device 61 and/or the second electronic device 65. In addition, although FIG. 9 only shows first, second and third electronic devices 61, 65, 71, additional electronic devices may be attached to any of the first, second and third electronic devices 61, 65, 71 depending on the overall configuration of the electronic package 60.

As an example, the third electronic device 71 may be soldered to at least one of the first electronic device 61 and the second electronic device 65. It should be noted that the third electronic device 71 may be attached to the first and/or second electronic devices 61, 65 in other ways. The manner in which the third electronic device 71 is attached to the first and/or second electronic devices 61, 65 will depend in part on the desired configuration and functionality of the electronic package 60.

FIGS. 10A-10D show an example packaging process (i.e., assembly flow) for the electronic package 60 illustrated in FIGS. 6 and 7.

FIGS. 11A-11D show an example packaging process (i.e., assembly flow) for the electronic package 60 illustrated in FIG. 8.

The electronic assemblies 30 and the electronic packages 60 described herein may be readily adapted for fabrication, especially when the electronic assemblies 30 and the electronic packages 60 are part of 3D or 2.5D stacks of electronic devices (e.g., dice). In addition, the electronic assemblies 30 and the electronic packages 60 described herein may effectively dissipate heat from a bottom electronic device that is part of a stack of electronic devices.

Figure 12:
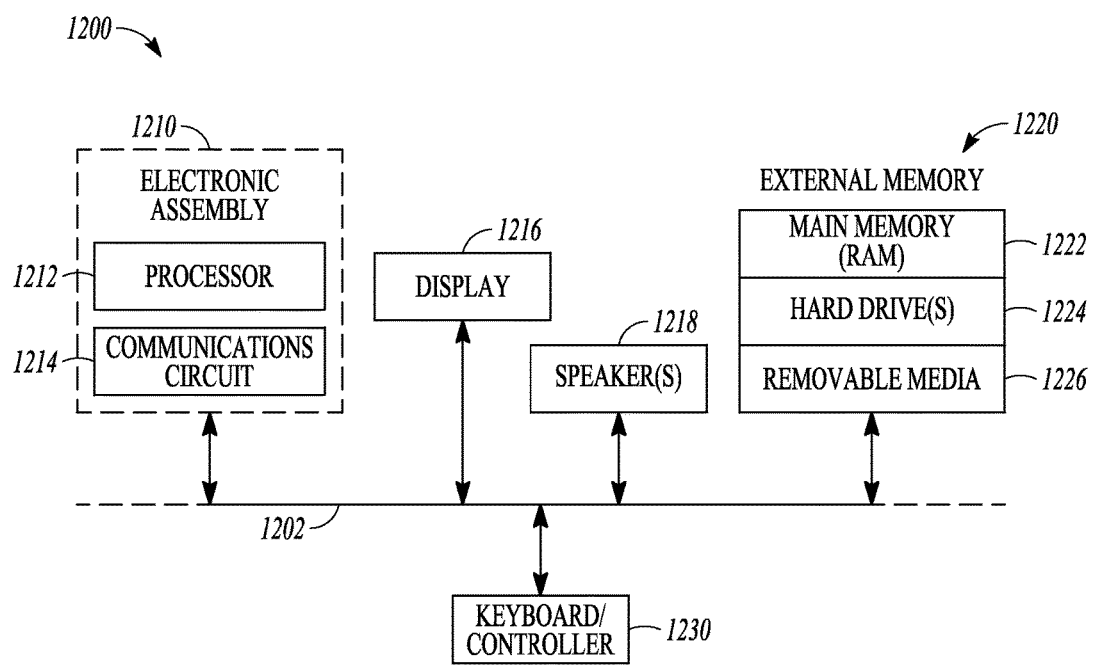
FIG. 12 is block diagram of an electronic apparatus that includes the electronic assemblies and/or the electronic packages described herein.

FIG. 12 is a block diagram of an electronic apparatus 1200 incorporating at least one electronic assembly 30 and/or electronic package 60 described herein. Electronic apparatus 1200 is merely one example of an electronic apparatus in which forms of the electronic assemblies 30 and/or electronic packages 60 described herein may be used. Examples of an electronic apparatus 1200 include, but are not limited to, personal computers, tablet computers, mobile telephones, game devices, MP3 or other digital music players, etc. In this example, electronic apparatus 1200 comprises a data processing system that includes a system bus 1202 to couple the various components of the electronic apparatus 1200. System bus 1202 provides communications links among the various components of the electronic apparatus 1200 and may be implemented as a single bus, as a combination of busses, or in any other suitable manner.

An electronic assembly 1210 as describe herein may be coupled to system bus 1202. The electronic assembly 1210 may include any circuit or combination of circuits. In one embodiment, the electronic assembly 1210 includes a processor 1212 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1210 are a custom circuit, an application-specific integrated circuit (ASIC), or the like, such as, for example, one or more circuits (such as a communications circuit 1214) for use in wireless devices like mobile telephones, tablet computers, laptop computers, two-way radios, and similar electronic systems. The IC can perform any other type of function.

The electronic apparatus 1200 may also include an external memory 1220, which in turn may include one or more memory elements suitable to the particular application, such as a main memory 1222 in the form of random access memory (RAM), one or more hard drives 1224, and/or one or more drives that handle removable media 1226 such as compact disks (CD), flash memory cards, digital video disk (DVD), and the like.

The electronic apparatus 1200 may also include a display device 1216, one or more speakers 1218, and a keyboard and/or controller 1230, which can include a mouse, trackball, touch screen, voice-recognition device, or any other device that permits a system user to input information into and receive information from the electronic apparatus 1200.

To better illustrate the method and apparatuses disclosed herein, a non-limiting list of embodiments is provided here:

Example 1 includes an electronic assembly that includes a first electronic device. The first electronic device includes a cavity that extends into a back side of the first electronic device. A second electronic device is mounted to the first electronic device within the cavity in the first electronic device.

Example 2 includes the electronic assembly of example 1, wherein at least one of the first electronic device and the second electronic device is a die.

Example 3 includes the electronic assembly of any one of examples 1-2, wherein the second electronic device is soldered to the first electronic device.

Example 4 includes the electronic assembly of any one of examples 1-3, wherein the cavity in the first electronic device extends partially through the first electronic device.

Example 5 includes the electronic assembly of any one of examples 1-4, wherein the first electronic device includes an interposer on a front side of the first electronic device, and wherein the cavity in the first electronic device extends through the first electronic device to the interposer.

Example 6 includes the electronic assembly of example 5, wherein the second electronic device is mounted to the interposer.

Example 7 includes the electronic assembly of any one of examples 1-6, wherein the first electronic device includes through silicon vias that are electrically connected to the second electronic device.

Example 8 includes an electronic package that includes a substrate and a first electronic device mounted on the substrate. The first electronic device includes a cavity that extends into a back side of the first electronic device. A second electronic device is mounted to the first electronic device within the cavity in the first electronic device.

Example 9 includes the electronic package of example 8, wherein the first electronic device includes through silicon vias that electrically connect the second electronic device to the substrate.

Example 10 includes the electronic package of any one of examples 8-9 and further including a third electronic device that is mounted to at least one of the first electronic device and the second electronic device.

Example 11 includes the electronic package of example 10, wherein the third electronic device is mounted to the first electronic device and the second electronic device.

Example 12 includes the electronic package of any one of examples 10-11, wherein the third electronic device is soldered to at least one of the first electronic device and the second electronic device.

Example 13 includes the electronic package of any one of examples 10-12, wherein at least one of the first electronic device, the second electronic device and the third electronic device is a die.

Example 14 includes the electronic package of any one of examples 8-13, wherein the second electronic device is soldered to the first electronic device.

Example 15 includes the electronic package of any one of examples 8-14, wherein the cavity in the first electronic device extends partially through the first electronic device.

Example 16 includes the electronic package of any one of examples 8-14, wherein the first electronic device includes an interposer on a front side of the first electronic device, and wherein the cavity in the first electronic device extends through the first electronic device to the interposer.

Example 17 includes the electronic package of any one of examples 8-16, wherein the first electronic device includes through silicon vias that electrically connect the first electronic device to the second electronic device.

Example 18 includes an electronic package that includes a substrate and a first electronic device mounted on the substrate. The first electronic device is soldered to the substrate and includes a cavity that extends into a back side of the first electronic device. A second electronic device is soldered to the first electronic device within the cavity in the first electronic device and a third electronic device is soldered to at least one of the first electronic device and the second electronic device.

Example 19 includes the electronic package of example 18, wherein at least one of the first electronic device, the second electronic device and the third electronic device is a die.

Example 20 includes the electronic package of examples 18-19, wherein the cavity in the first electronic device extends partially through the first electronic device.

These and other examples and features of the present electronic assemblies and electronic packages will be set forth in part in the detailed description.

This overview is intended to provide non-limiting examples of the present subject matter. It is not intended to provide an exclusive or exhaustive explanation. The detailed description is included to provide further information about the electronic assemblies 30 and/or electronic packages 60 described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly, comprising:
   a first integrated circuit die that includes a multi-sided cavity that extends into a back side of the first integrated circuit die, wherein the first integrated circuit die includes a portion that connects each side of the multisided cavity and a planar bottom surface of the multi-sided cavity, wherein the portion is the same material as each side of the multisided cavity and the planar bottom surface, and wherein the planar bottom surface extends from each side of the multisided cavity to every other side of the multisided cavity;
   a second integrated circuit die mounted to the first integrated circuit die within the multi-sided cavity in the first electronic device, wherein the second integrated circuit die includes a front side that engages the planar bottom surface of the multi-sided cavity in the first integrated circuit die and a back side; and
   a heat spreader that engages the back side of the first integrated circuit die and the back side of the second integrated circuit die, wherein the heat spreader includes a side that is parallel to a side of the first integrated circuit die and extends below the back side of the first integrated circuit die pass the planar bottom surface of the multi-sided cavity to cover side surfaces of the first integrated circuit die, wherein the multi-sided cavity in the first integrated circuit die extends partially through the first integrated circuit die.

2. The electronic assembly of claim 1, wherein the second integrated circuit die is soldered to the first integrated circuit die.

3. The electronic assembly of claim 1, wherein the first integrated circuit die includes through silicon vias that are electrically connected to the second integrated circuit die.

4. An electronic package, comprising:
   a substrate;
   a first integrated circuit die that includes a front side and a backside, the front side of the first integrated circuit die being mounted on the substrate, the first integrated circuit die includes a multi-sided cavity that extends into a back side of the first integrated circuit die, wherein the first integrated circuit die includes a portion that connects each side of the multisided cavity with a planar bottom surface of the multi-sided cavity, wherein the portion is the same material as each side of the multisided cavity and the planar bottom surface, and wherein the planar bottom surface extends from each side of the multisided cavity to every other side of the multisided cavity; and a second integrated circuit die mounted to the first integrated circuit die within the multi-sided cavity in the first integrated circuit die, wherein the second integrated circuit die includes a front side that engages the planar bottom surface of the multi-sided cavity in the first integrated circuit die and a back side; and a heat spreader that includes side surfaces that are parallel to sides of the first integrated circuit die and extend below the back side of the first integrated circuit die, wherein the heat spreader engages the back side of the first integrated circuit die, the back side of the second integrated circuit die and the substrate such the heat spreader and the substrate enclose the first and second electronic dice, wherein the multi-sided cavity in the first integrated circuit die extends partially through the first integrated circuit die.

5. The electronic package of claim 4, wherein the first integrated circuit die includes through silicon vias that electrically connect the second integrated circuit die to the substrate.

6. The electronic package of claim 4, wherein the second integrated circuit die is soldered to the first integrated circuit die.

7. An electronic package, comprising:

a substrate;

a first integrated circuit die that includes a front side and a backside, the front side of the first integrated circuit die being soldered to the substrate, the first integrated circuit die includes a multi-sided cavity that extends into a back side of the first integrated circuit die, wherein the first integrated circuit die includes a portion that connects a each side of the multisided cavity and a planar bottom surface of the multi-sided cavity, wherein the portion is the same material as each side of the multisided cavity and the planar bottom surface, and wherein the planar bottom surface extends from each side of the multisided cavity to every other side of the multisided cavity; and a second integrated circuit die soldered to the first integrated circuit die within the multi-sided cavity in the first integrated circuit die, wherein the second integrated circuit die includes a front side that engages the planar bottom surface of the multi-sided cavity in the first integrated circuit die and a back side; and a heat spreader that engages the back side of the first integrated circuit die, wherein the heat spreader includes a side that is parallel to a side of the first integrated circuit die and extends below the back side of the first integrated circuit die such that the heat spreader covers side surfaces of the first integrated circuit die, wherein the multi-sided cavity in the first integrated circuit die extends partially through the first integrated circuit die.

* * * * *